(12) United States Patent
Nash et al.

(10) Patent No.: US 8,489,377 B2
(45) Date of Patent: Jul. 16, 2013

(54) METHOD OF VERIFYING THE PERFORMANCE MODEL OF AN INTEGRATED CIRCUIT

(75) Inventors: Reuel William Nash, Austin, TX (US); Yu Bai, Shanghai (CN); Xiaowei Li, Shanghai (CN)

(73) Assignee: Nvidia Corporation, Santa Clara, CA (US)

( * ) Notice: Subject to any disclaimer, the term of this patent is extended or adjusted under 35 U.S.C. 154(b) by 619 days.

(21) Appl. No.: 12/638,865

(22) Filed: Dec. 15, 2009

(65) Prior Publication Data
US 2010/0262415 A1  Oct. 14, 2010

(30) Foreign Application Priority Data
Apr. 9, 2009   (CN) .......................... 2009 1 0131892

(51) Int. Cl.
*G06F 17/50*   (2006.01)

(52) U.S. Cl.
USPC .............................................. 703/14; 703/13

(58) Field of Classification Search
USPC .......................................................... 703/14
See application file for complete search history.

(56) References Cited

U.S. PATENT DOCUMENTS

| | | | |
|---|---|---|---|
| 4,063,308 A | 12/1977 | Collins et al. | |
| 5,276,858 A | 1/1994 | Oak et al. | |
| 5,643,086 A | 7/1997 | Alcorn et al. | |
| 5,752,062 A | 5/1998 | Gover et al. | |
| 5,757,919 A | 5/1998 | Herbert et al. | |
| 5,815,154 A | 9/1998 | Hirschtick et al. | |
| 5,978,484 A | 11/1999 | Apperson et al. | |
| 6,016,474 A | 1/2000 | Kim et al. | |
| 6,088,774 A | 7/2000 | Gillingham | |
| 6,157,618 A | 12/2000 | Boss et al. | |
| 6,330,008 B1 | 12/2001 | Razdow et al. | |
| 6,334,174 B1 | 12/2001 | Delp et al. | |
| 6,362,825 B1 | 3/2002 | Johnson | |
| 6,424,198 B1 | 7/2002 | Wolford | |
| 6,438,670 B1 | 8/2002 | McClannahan | |
| 6,668,325 B1 | 12/2003 | Collberg et al. | |
| 6,684,314 B1 | 1/2004 | Manter | |
| 6,732,060 B1 | 5/2004 | Lee | |
| 6,779,096 B1 | 8/2004 | Cornelius et al. | |
| 6,829,191 B1 | 12/2004 | Perner et al. | |
| 6,898,682 B2 | 5/2005 | Welker et al. | |
| 6,901,582 B1 | 5/2005 | Harrison | |
| 6,934,824 B2 | 8/2005 | Woo et al. | |
| 6,934,899 B2 | 8/2005 | Yuan et al. | |
| 6,943,800 B2 | 9/2005 | Taylor et al. | |
| 7,047,519 B2 | 5/2006 | Bates et al. | |
| 7,095,416 B1 | 8/2006 | Johns et al. | |

(Continued)

OTHER PUBLICATIONS

Soundararajan, et al. "Dynamic Partitioning of the Cache Hierarchy in Shared Data Centers" Aug. 2008.*

(Continued)

*Primary Examiner* — Saif Alhija

(57) ABSTRACT

A method of verifying a performance model of an integrated circuit is provided. The method comprises the following steps: obtaining statistical request numbers and corresponding latency values of memory access requests; developing functions of latency value based on the statistical request numbers and the corresponding latency values; bringing a random value to one of the functions to retrieve a latency value; and verifying the logic of the performance model using the latency value retrieved in the step above.

20 Claims, 6 Drawing Sheets

U.S. PATENT DOCUMENTS

| | | |
|---|---|---|
| 7,107,484 B2 | 9/2006 | Yamazaki et al. |
| 7,173,635 B2 | 2/2007 | Amann et al. |
| 7,237,151 B2 | 6/2007 | Swoboda et al. |
| 7,260,066 B2 | 8/2007 | Wang et al. |
| 7,277,826 B2 | 10/2007 | Castelli et al. |
| 7,383,205 B1 | 6/2008 | Peinado et al. |
| 7,395,426 B2 | 7/2008 | Lee et al. |
| 7,420,563 B2 | 9/2008 | Wakabayashi |
| 7,505,953 B2 | 3/2009 | Doshi |
| 7,555,499 B2 | 6/2009 | Shah et al. |
| 7,778,800 B2 | 8/2010 | Aguaviva et al. |
| 2001/0044928 A1 | 11/2001 | Akaike et al. |
| 2002/0013881 A1 | 1/2002 | Delp et al. |
| 2002/0157086 A1 | 10/2002 | Lewis et al. |
| 2003/0043022 A1 | 3/2003 | Burgan et al. |
| 2003/0214660 A1 | 11/2003 | Plass et al. |
| 2004/0030853 A1 | 2/2004 | Welker et al. |
| 2004/0085894 A1 | 5/2004 | Wang et al. |
| 2004/0130552 A1 | 7/2004 | Duluk, Jr. et al. |
| 2005/0222881 A1 | 10/2005 | Booker |
| 2005/0243094 A1 | 11/2005 | Patel et al. |
| 2005/0273652 A1 | 12/2005 | Okawa et al. |
| 2005/0278684 A1 | 12/2005 | Hamilton et al. |
| 2006/0079333 A1 | 4/2006 | Morrow et al. |
| 2006/0080625 A1 | 4/2006 | Bose et al. |
| 2006/0109846 A1 | 5/2006 | Lioy et al. |
| 2006/0161761 A1 | 7/2006 | Schwartz et al. |
| 2006/0185017 A1 | 8/2006 | Challener et al. |
| 2007/0115292 A1 | 5/2007 | Brothers et al. |
| 2007/0274284 A1 | 11/2007 | Dendukuri et al. |
| 2008/0007563 A1 | 1/2008 | Aronson et al. |
| 2008/0095090 A1 | 4/2008 | Lee et al. |

OTHER PUBLICATIONS

"ATI Redeon X800, 3D Architecture White Paper", ATI, 2005, pp. 1-13, with proof of seniority (4 pages), according to ACM bibliography regarding the document: "The Direct3D 10 system", ACM TOG, vol. 25, Iss. 3 (Jul. 2006), Reference 1; eHG.

"maxVUE Graphic Editor", Metso Automation, 2005, pp. 1-6, http://www.metsoautomation.com/automation/indes.nsf/FR?Readform&ATL=automation/ed_prod.nsf/WebWID/WTB-041110-22256F-2445A; eHB.

C. Cebenoyan and M. Wloka, "optimizing the graphics pipeline", 203, Nvidia GDC Presentation Slide.

Duca et al., A Relational Debugging Engine for Graphics Pipeline, International Conference on Computer Graphics and Interactive Techniques, ACM SIGGRAPH 2005, pp. 453-463, ISSN: 0730-0301.

gDEBugger, graphicREMEDY, http://www.gremedy.com/ Jul. 29, 2005.

gDEBugger, graphicREMEDY, http://www.gremedy.com/ Aug. 8, 2006.

N. Tatarchuk, "New RenderMonkey Features for DirectX and OpenGL Shader Development", Game Developers Conference, Mar. 2004.

\* cited by examiner

METHOD OF VERIFYING THE PERFORMANCE MODEL OF AN INTEGRATED CIRCUIT

CROSS-REFERENCES TO RELATED APPLICATIONS

This Application claims priority to Chinese Patent Application 200910131892.8, filed Apr. 9, 2009.

FIELD OF INVENTION

The present invention generally relates to a computer-aided design of integrated circuits and, more specifically, to the verification of the performance model of an integrated circuit in a memory latency simulation environment.

BACKGROUND OF THE INVENTION

When a processor submits a request to a memory device, e.g., a Dynamic Random Access Memory (DRAM), the response from the memory device can be read by the processor after a delay of time, referred to as a "latency." For example, a processor may issue a read request to a cache memory system; after a period of time, the cache memory system responds by placing the requested data on the bus. The processor can then receive the data from the bus after the latency expires. If the processor attempts to receive the data from the bus before the latency expires, the processor is likely to receive inaccurate and invalid data. Therefore when designing processors, it is crucial to take the memory latency into consideration.

In conventional computer-aided designs of processor or other integrated circuits, a lot of man and machine hours are needed to verify that the model of the integrated circuit is correct. For example, an architectural model, typically written by an engineering team, of the integrated circuit is used to define the functional requirements. Then a Register Transfer Level (RTL) model of the integrated circuit is then produced, typically by another engineering team, and the logic or the functionality of the RTL model is verified against the architectural model. Conventionally, the verification is performed with a "fixed latency" model (or so-called simulation environment), in which the memory latency values are set fixed. Actually, the amount of latency can vary depending on several factors, for example, the types of request. The amount of latency can also vary among the same types of request. Therefore, "fixed latency" is not accurate enough for the verification.

Based on the foregoing, there is a need for a more accurate and dynamic latency model to perform the verification of an integrated circuit.

SUMMARY OF THE INVENTION

The present invention is to provide a method of verifying a performance latency model of an integrated circuit and a method of designing an integrated circuit.

One aspect of the present invention is to adopt "dynamic latency" in the verification of an integrated circuit. Another aspect of the present invention is to create a new memory latency model for the verification of an integrated circuit. Still another aspect of the present invention is to assign the latency value(s) randomly for the verification of an integrated circuit. Yet another aspect of the present invention is to assign the latency value(s) in a manner related to statistical latency data.

In one embodiment, the method of verifying a performance model of an integrated circuit comprises the following steps: obtaining statistical request numbers and corresponding latency values of memory access; developing functions of latency value based on the statistical request numbers and the corresponding latency values; bringing a random value to one of the functions to retrieve a latency value; and verifying the logic of the performance model using the latency value retrieved in the step above.

In another embodiment, the method of designing an integrated circuit comprises: writing source code of the integrated circuit, and verifying a performance model, e.g., an RTL model, of the integrated circuit. The later step may further include obtaining statistical request numbers and corresponding latency values of memory access; developing functions of latency value based on the statistical request numbers and the corresponding latency values; bringing a random value to one of the functions to retrieve a latency value; and verifying the logic of the performance model using the latency value retrieved in the step above.

In yet another embodiment, the method of dynamically verifying memory latency in an integrated circuit comprises: writing source code of the integrated circuit, and verifying a performance model of the integrated circuit. The later step may further include obtaining statistical request numbers and corresponding latency values of memory access; developing functions of latency value based on the statistical request numbers and the corresponding latency values; bringing a random value to one of the functions to retrieve a latency value; bringing another random value to one of the functions to retrieve another latency value and verifying the logic of the performance model using the latency values retrieved in the steps above.

The foregoing and other features of the invention will be apparent from the following more particular description of embodiment of the invention.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following descriptions, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
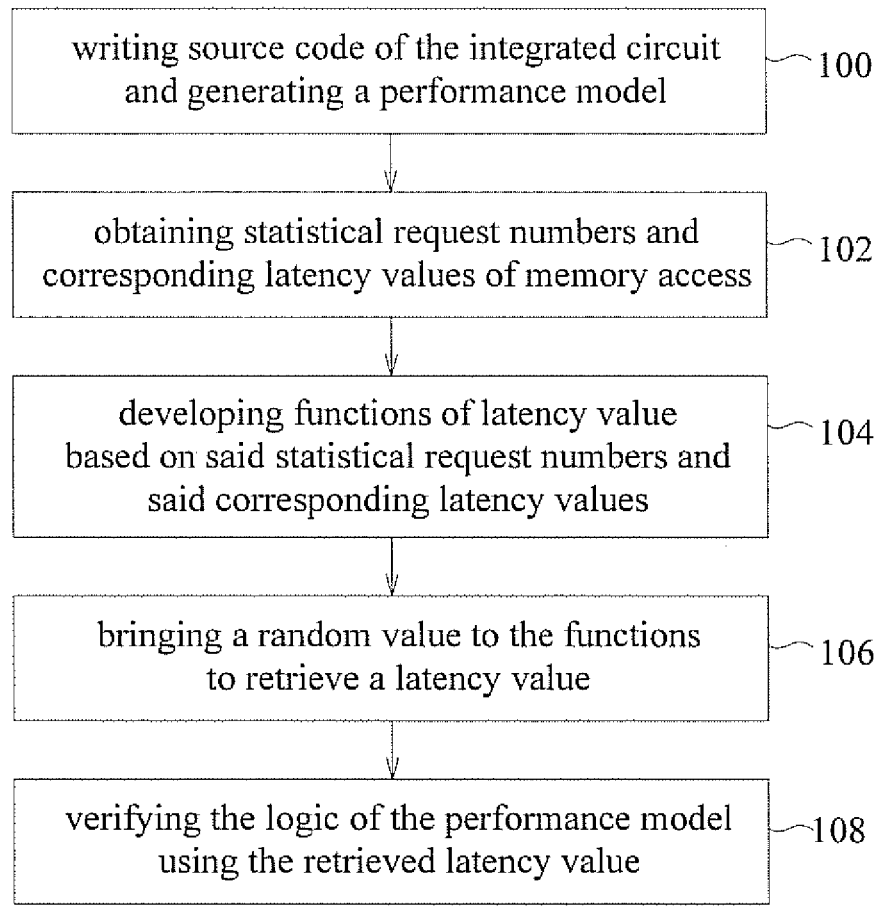
FIG. 1 illustrates a flow diagram of an exemplary method of designing an integrated circuit in accordance with one or more aspects of the present invention.

FIG. 1 illustrates a flow diagram of an exemplary method of designing an integrated circuit, e.g., graphic processor unit (GPU) chip, in accordance with one or more aspects of the present invention. In step 100, source code for the integrated circuit is written, using a programming language, such as "C++", and a performance model of the chip in RTL, for example, is created. In the integrated circuit design, RTL description is a way of describing the operation of a synchronous digital circuit. In the RTL design, a circuit's behavior is defined in terms of the flow of signals (or transfer of data) between the hardware registers, and the logical operations performed on those signals.

Figure 2:
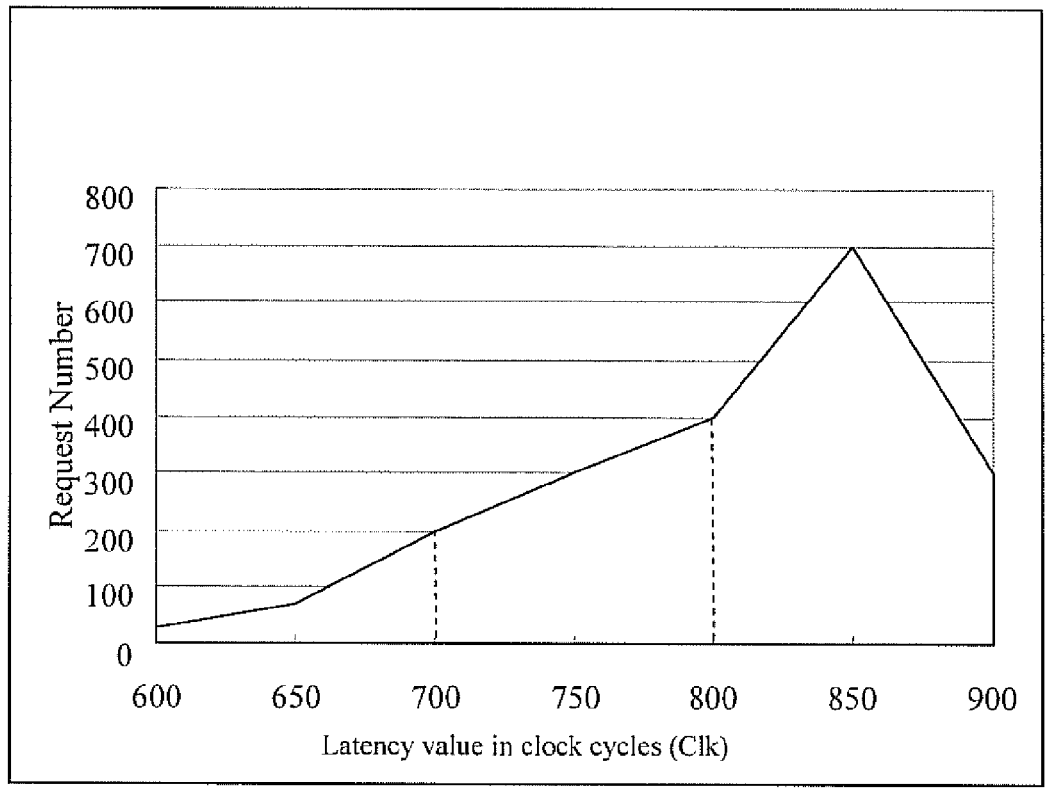
FIG. 2 is a graph showing statistical data according to an embodiment of the present invention.

In step 102, statistical data such as request numbers and corresponding latency values of memory access are collected to create a memory latency distribution model. FIG. 2. illustrates an example of the memory latency distribution model, where the X-axis represents the latency values in terms of clock cycle (Clk) and the Y-axis represents the request numbers. Note that the statistical request numbers and latency values in the present invention could be collected from the historical data of a real system or could be generated from a computer simulation as illustrated in the example shown in FIG. 2. Also note that the statistical request numbers may be directed to only one type of request, e.g., read request or write request, or in some embodiments the statistical request numbers could be collected regardless of the type of request.

From the statistical data in the example of FIG. 2, there are 2,000 requests in total and the latency values of the requests range from 600 Clks to 900 Clks. The whole range of the latency value (e.g., 600-900 Clks) may be further divided into three ranges of 600-700 Clks, 700-800 Clks, and 800-900 Clks. It could be found that there are 300 requests, 15% of the total requests, resulting in a latency value in the first range of 600 Clks to 700 Clks; another 700 requests, 35% of the total requests, causing a latency value in the second range of 700 Clks to 800 Clks; and finally 1000 requests, 50% of the total requests, generating a latency value in the third range of 800 Clks to 900 Clks. Note that in other embodiments, the whole range of latency value may be further divided into any number of equal or unequal "sub-ranges" for different application purposes, and the requests accumulated in a "sub-range" of the latency value and its ratio to the total requests may change accordingly.

In step 104, a predetermined function for each divided range (or sub-range) is developed based on the requests accumulated in the divided range, e.g., one of the ranges of 600-700 Clks, 700-800 Clks, or 800-900 Clks. It is preferable that the predetermined functions are piecewise linear functions, but other continuous or discontinuous, linear or nonlinear, functions which are able to describe the latency distribution could be also adopted in the present invention.

Figure 3A:
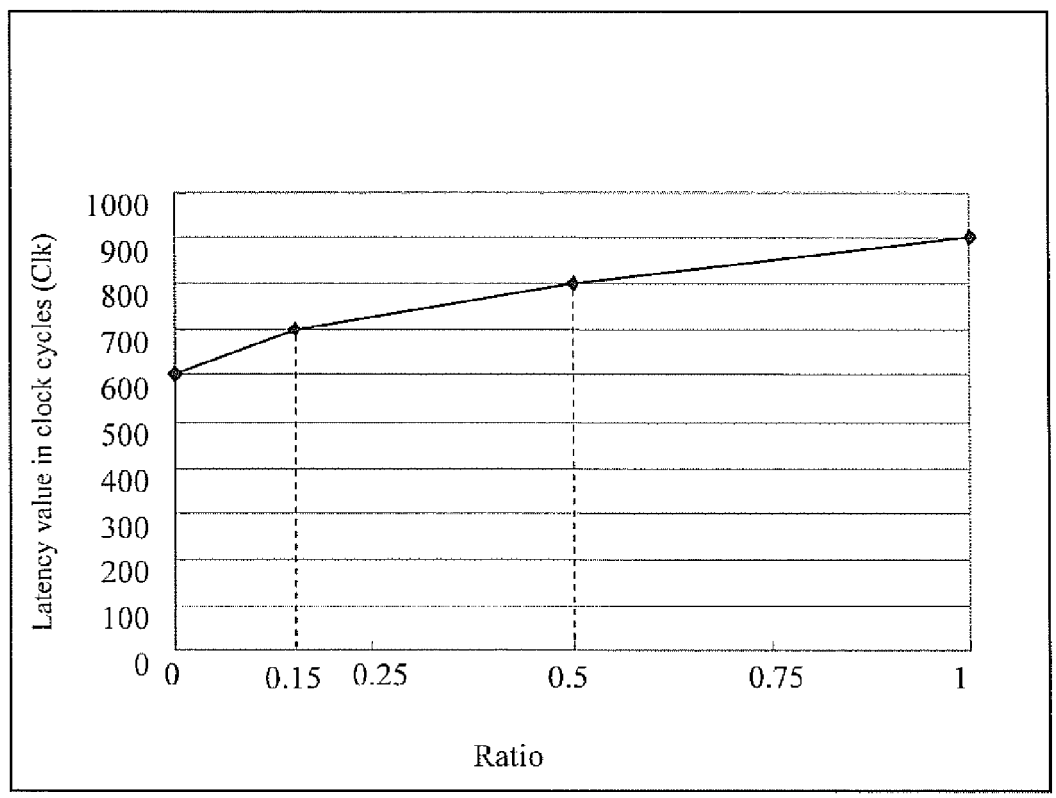
FIGS. 3a, 3b, 3c and 3d illustrate exemplary piecewise linear functions according to one or more embodiments of the present invention.

In this example, the ratios of the requests in each divided range to the total requests are furthered used to define the segment of the piecewise linear function. For example, while the requests in the first range of 600-700 Clks are 15% of the total requests, the piecewise linear function for the first range of 600-700 Clks is established between the points 0 and 0.15. Next, the piecewise linear function for the second range of 700-800 Clks is established between 0.15 and 0.5, and the piecewise linear function for the third range of 800-900 Clks is established between 0.5 and 1. The exemplary piecewise linear functions are listed as below and illustrated in FIG. 3a, wherein the X-axis represents the accumulated ratio of the requests to the total, and the Y-axis represents the latency values in terms of clock cycle (Clk).

$$Y=X*(700-600)/(0.15-0.0)+600, \text{ where } X \text{ is between 0 and 0.15;}$$

$$Y=(X-0.15)*(800-700)/(0.5-0.15)+700, \text{ where } X \text{ is between 0.15 and 0.5;}$$

$$Y=(X-0.5)*(900-800)/(1.0-0.5)+800, \text{ where } X \text{ is between 0.5 and 1.}$$

In step 106, a random value or more random values are selected from a range of 0 to 1 and are brought into the piecewise linear functions listed above as the ratio in X-axis to retrieve the latency value(s) in Y-axis. For example, if the random value is 0.1, which is in the range of 0 to 0.15, then the random value of 0.1 is brought into the first piecewise linear function and a latency value of 666.67 Clks is obtained; if the random value is 0.75, which is in the range of 0.5 to 1, then the random value of 0.75 is brought into the third piecewise linear function and a latency value of 850 Clks is obtained. In this manner, the memory latency for an access could be simulated in a dynamic manner which could be more similar to the real case. In step 108, one or more retrieved latency values are used in the verification of the logic of the performance model.

Note that in step 104 mentioned above, it is not necessary to have the ratio of the requests to the total for the present invention. In some embodiments, the segment of the piecewise linear function could be defined directly by the statistical request numbers, and accordingly the random value is selected from the range of entire statistical request numbers in the step 106.

Also note that the steps 102 to 106 described above may be embodied in a software product, which could be written in a common programming language such as "C++", and could be executed on a personal computer or a workstation. The software product for performing the steps 102 to 106 could be a standalone product or a functional module to be combined with other module(s) for analyzing the queuing behavior, e.g., in an integrated software product for verification.

In another example the statistical data discussed with respect to FIG. 2, assume there are 2,000 requests in total and the latency values of the requests range from 600 Clks to 900 Clks. The whole range (e.g., 600-900 Clks) may be divided into two ranges of 600-750 Clks, and 750-900 Clks. It could be found that there are 650 requests, 32.5% of the total requests, resulting in a latency value in the first range of 600 Clks to 750 Clks; there are 1350 requests, 67.5% of the total requests, generating a latency value in the second range of 750 Clks to 900 Clks.

Figure 3B:
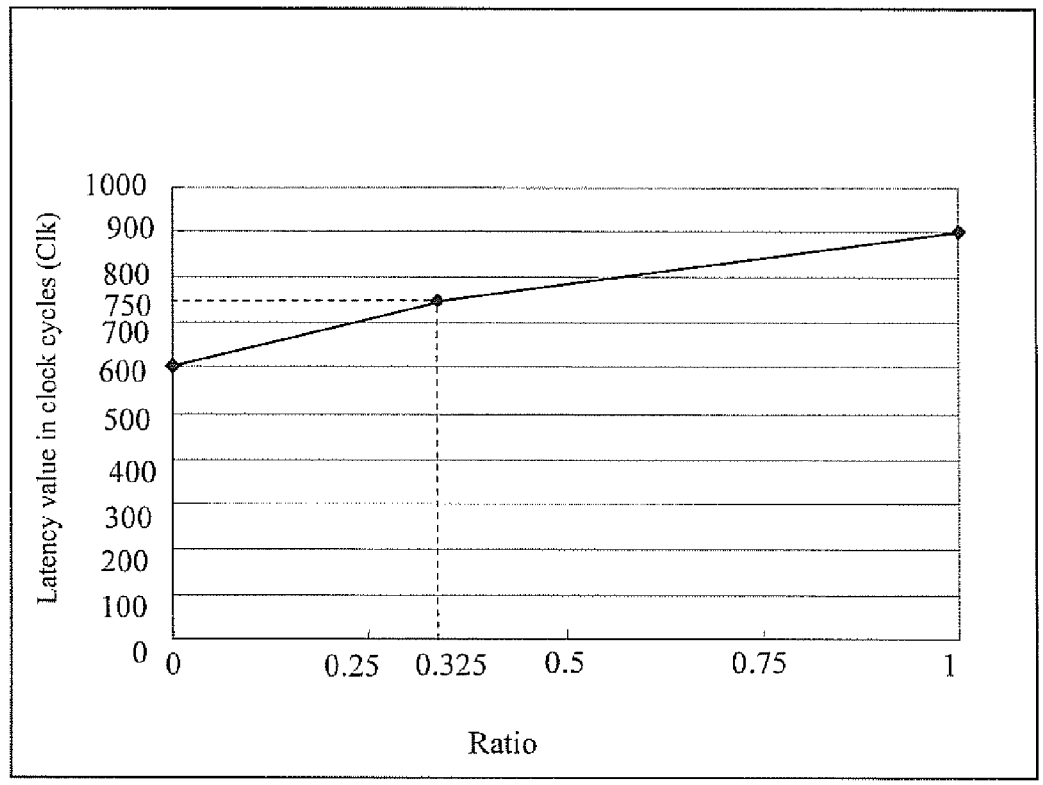

In step 104, two piecewise linear functions are developed based on the requests accumulated in the ranges of 600-750 Clks and 750-900 Clks. Similar to what has been described above, the ratio of the requests in each divided range to the total requests is used to define the segment of the piecewise linear function. For example, while the requests in the first range of 600 Clks to 750 Clks account for 32.5% of the total request numbers, the piecewise linear function for the first range of 600 Clks to 750 Clks is established between points 0 and 0.325. Accordingly, the piecewise linear function for the second range of 750 Clks to 900 Clks is established between 0.325 and 1. The exemplary piecewise linear functions are listed as below and illustrated in FIG. 3b.

$$Y=X*(750-600)/(0.325-0.0)+600, \text{ where } X \text{ is between 0 and 0.325; and}$$

$$Y=(X-0.325)*(900-750)/(1-0.325)+750, \text{ where } X \text{ is between 0.325 and 1.}$$

In step 106, if the random value is 0.1, which is in the range of 0 to 0.325, then the random value of 0.1 is brought into the first piecewise linear function and a latency value of 646.15 Clks is obtained; if the random value is 0.75, which is in the range of 0.325 to 1, then the random value of 0.75 is brought into the second piecewise linear function and a latency value of 844.44 Clks is obtained.

In still another example of FIG. 2, assume there are 2,000 requests in total and the latency values of the requests range from 600 Clks to 700 Clks and from 700 Clks to 900 Clks respectively. It could be found that there are 300 requests, 15% of the total requests, resulting in a latency value in the first range of 600 Clks to 700 Clks; and there are 1700 requests, 85% of the total requests, generating a latency value in the second range of 700 Clks to 900 Clks.

Figure 3C:
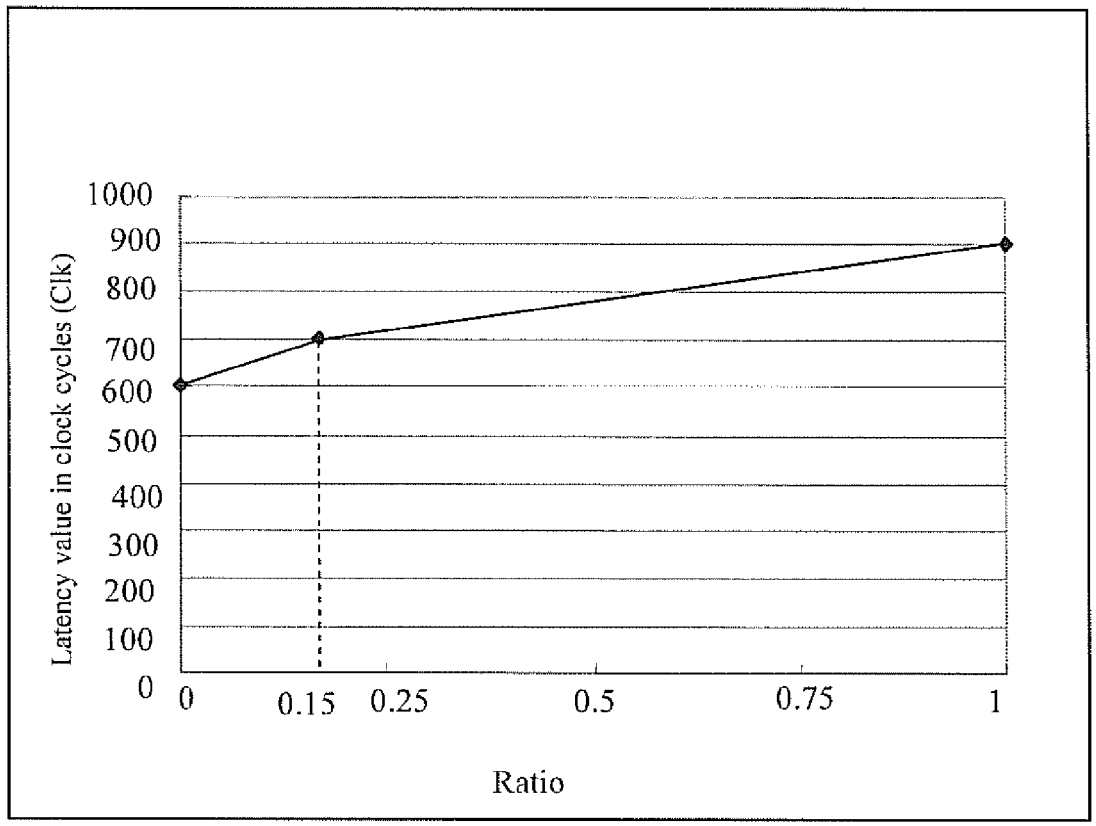

In step 104, two piecewise linear functions are developed based on the requests accumulated in the ranges of 600-700 Clks and 700-900 Clks. Likewise, the ratio of the requests in each divided range to the total requests is used to define the segment of the piecewise linear function. For example, while the requests in the first range of 600 Clks to 700 Clks are 15% of the total requests, the piecewise linear function for the first range of 600 Clks to 700 Clks is established between points 0 and 0.15. Accordingly, the piecewise linear function for the second range of 700 Clks to 900 Clks is established between 0.15 and 1. The exemplary piecewise linear functions are listed as below and illustrated in FIG. 3c.

$$Y=X*(700-600)/(0.15-0.0)+600, \text{ where } X \text{ is between } 0 \text{ and } 0.15; \text{ and}$$

$$Y=(X-0.15)*(900-700)/(1-0.15)+700, \text{ where } X \text{ is between } 0.15 \text{ and } 1.$$

In step 106, if the random value is 0.1, which is in the range of 0 to 0.15, then the random value of 0.1 is brought into the first piecewise linear function and a latency value of 666.67 Clks is obtained; if the random value is 0.75, which is in the range of 0.15 to 1, then the random value of 0.75 is brought into the second piecewise linear function and a latency value of 841.18 Clks is obtained.

In yet another example of FIG. 2, the requests having the latency values in the range of 700 Clks to 800 Clks may be disregarded, so there are 1,300 requests in total and the latency values of the requests range only from 600 Clks to 700 Clks and from 800 Clks to 900 Clks. It could be found that there are 300 requests, 23.1% of the total requests, resulting in a latency value in the first range of 600 Clks to 700 Clks; and there are 1,000 requests, 76.9% of the total requests, generating a latency value in the second range of 800 Clks to 900 Clks.

Figure 3D:
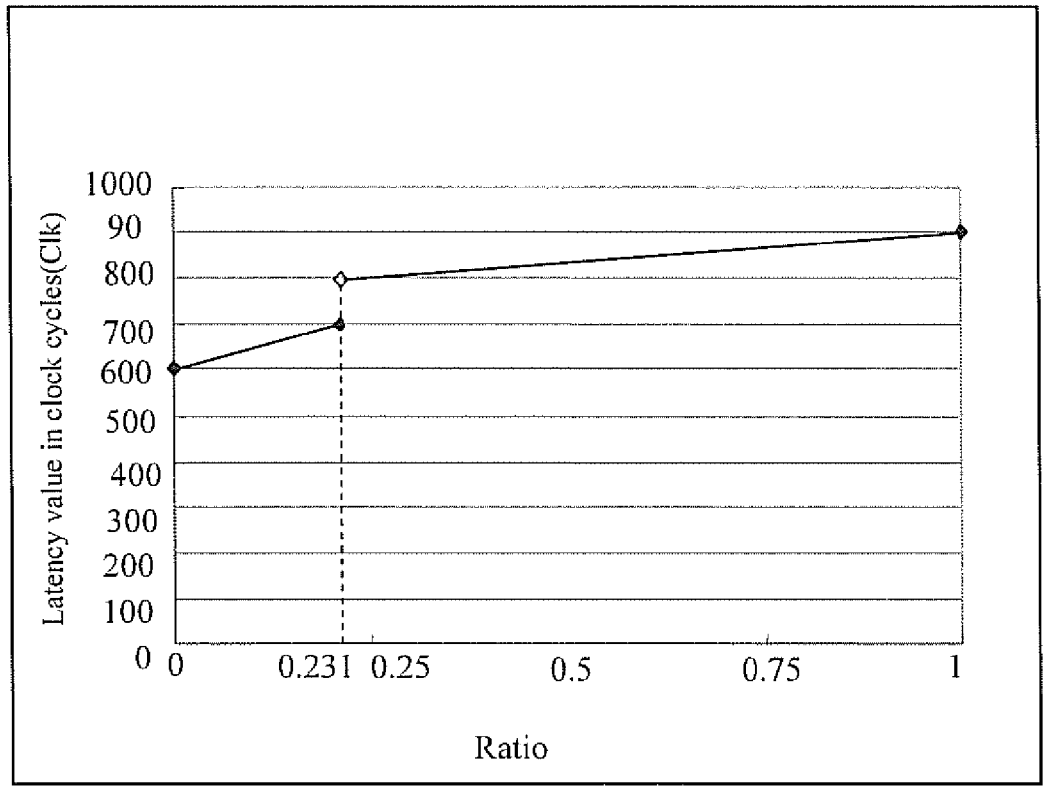

In step 104, two piecewise linear functions are developed based on the request accumulated in the ranges of 600-700 Clks and 800-900 Clks. Likewise, the ratio of the requests in each divided range to the total requests is used to define the segment of the piecewise linear function. For example, while the request numbers in the first range of 600 Clks to 700 Clks account for 23.1% of the total requests, the piecewise linear function for the first range of 600 Clks to 700 Clks is established between points 0 and 0.231. Accordingly, the piecewise linear function for the second range of 800 Clks to 900 Clks is established between 0.231 and 1. Then the piecewise linear functions are listed as below and illustrated in FIG. 3d.

$$Y=X*(700-600)/(0.231-0)+600, \text{ where } X \text{ is between } 0 \text{ and } 0.231; \text{ and}$$

$$Y=(X-0.231)*(900-800)/(1-0.231)+800, \text{ where } X \text{ is between } 0.231 \text{ and } 1.$$

Note that these two piecewise linear functions are discontinuous, and the first piecewise linear function may be predetermined inclusive at point 0.231.

In step 106, if the random value is 0.1, which is in the range of 0 to 0.231, then the random value of 0.1 is brought into the first piecewise linear function and a latency value of 643.29 Clks is obtained; if the random value is 0.75, which is in the range of 0.231 to 1, then the random value of 0.75 is brought into the second piecewise linear function and a latency value of 867.49 Clks is obtained.

While this invention has been described with reference to the illustrative embodiments, these descriptions should not be construed in a limiting sense. Various modifications of the illustrative embodiments, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. A computer implemented method of verifying a performance model of an integrated circuit, comprising:
   accessing a description of said integrated circuit;
   generating a performance model of said integrated circuit; and
   verifying, using a computer, said performance model, said verifying comprising:
   (a) obtaining statistical request numbers and corresponding latency values of memory access requests;
   (b) developing at least one latency function based on said statistical request numbers and said corresponding latency values;
   (c) inputting a random value to the at least one latency function to retrieve a latency value; and
   (d) verifying the said performance model using said latency value retrieved.

2. The method of claim 1, wherein said at least one function is a piecewise linear function.

3. The method of claim 2, wherein (a) further comprises determining at least a first range and a second range within a range of said corresponding latency values and deriving a first request number of requests accumulated in said first range and a second request number of requests accumulated in said second range.

4. The method of claim 3, wherein (b) further comprises determining a first piecewise linear function for said first range based on said first request number and determining a second piecewise linear function for said second range based on said second request number.

5. The method of claim 4, wherein said first range and said second range are not equal.

6. The method of claim 4, wherein said first range and said second range are not adjacent to each other.

7. The method of claim 4, wherein requests are also found accumulated in a third range other than said first range and said second range.

8. The method of claim 4, wherein said random value is selected from a range of said statistical request numbers.

9. The method of claim 4, wherein (a) further comprises deriving a first ratio of requests accumulated in said first range to a sum of requests accumulated in said first range and in said second range and deriving a second ratio of requests accumulated in said second range to said sum; and
   wherein (b) further comprises using said first ratio to define a segment of said first piecewise linear function and using said second ratio to define a segment of said second piecewise linear function.

10. The method of claim 9, wherein said random value is selected from 0 to 1.

11. A computer implemented method of designing an integrated circuit, comprising:

accessing source code of said integrated circuit;
generating a performance model of said integrated circuit in Register Transfer Level (RTL); and
verifying, using a computer, said performance model, the verifying comprising:
(a) obtaining statistical request numbers and corresponding latency values of memory access requests;
(b) developing at least one latency function of latency value based on said statistical request numbers and said corresponding latency values;
(c) inputting a random value to the at least one of said function to retrieve a latency value; and
(d) verifying the logic of said performance model using said latency value retrieved.

12. The method of claim 11, wherein said at least one function is a piecewise linear function.

13. The method of claim 12, wherein (a) further comprises determining at least a first range and a second range within the range of said corresponding latency values and deriving a first request number of requests accumulated in said first range and a second request number of requests accumulated in said second range.

14. The method of claim 13, wherein (b) further comprises determining a first piecewise linear function for said first range based on said first request number and determining a second piecewise linear function for said second range based on said second request number.

15. The method of claim 14, wherein (a) further comprises deriving a first ratio of requests accumulated in said first range to a sum of requests accumulated in said first range and in said second range and deriving a second ratio of requests accumulated in said second range to said sum;
wherein (b) further comprises using said first ratio to define a segment of said first piecewise linear function and using said second ratio to define a segment of said second piecewise linear function.

16. A computer implemented method of dynamically simulating memory latency for designing an integrated circuit, the method comprising:
accessing source code of said integrated circuit;
generating a performance model of said integrated circuit; and
verifying, using a computer, said performance model, the verifying comprising:
(a) obtaining statistical request numbers and corresponding latency values of memory access requests;
(b) developing at least one latency function based on said statistical request numbers and said corresponding latency values;
(c) inputting a random value to the at least one function to retrieve a latency value;
(d) inputting another random value to the at least one function to retrieve another latency value, and
(e) verifying the performance model using said latency values retrieved.

17. The method of claim 16, wherein said at least one function is a piecewise linear function.

18. The method of claim 17, wherein (a) further comprises determining at least a first range and a second range within the range of said corresponding latency values and deriving a first request number of requests accumulated in said first range and a second request number of requests accumulated in said second range.

19. The method of claim 18, wherein (b) further comprises determining a first piecewise linear function for said first range based on said first request number and determining a second piecewise linear function for said second range based on said second request number.

20. The method of claim 19, wherein (a) further comprises deriving a first ratio of requests accumulated in said first range to a sum of requests accumulated in said first range and in said second range and deriving a second ratio of requests accumulated in said second range to said sum;
wherein (b) further comprises using said first ratio to define a segment of said first piecewise linear function and using said second ratio to define a segment of said second piecewise linear function.

* * * * *